US009202782B2

(12) United States Patent
Chuah

(10) Patent No.: US 9,202,782 B2
(45) Date of Patent: Dec. 1, 2015

(54) EMBEDDED PACKAGE IN PCB BUILD UP

(71) Applicant: Tin Poay Chuah, Bayan Lepas (MY)

(72) Inventor: Tin Poay Chuah, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 13/735,776

(22) Filed: Jan. 7, 2013

(65) Prior Publication Data

US 2014/0191420 A1 Jul. 10, 2014

(51) Int. Cl.
*H01L 23/48* (2006.01)
*H01L 23/52* (2006.01)
*H01L 29/40* (2006.01)
*H01L 23/498* (2006.01)
*H01L 23/538* (2006.01)

(52) U.S. Cl.
CPC ...... *H01L 23/49833* (2013.01); *H01L 23/5389* (2013.01); *H01L 23/49827* (2013.01); *H01L 2924/0002* (2013.01); *H01L 2924/01013* (2013.01); *H01L 2924/01029* (2013.01); *H01L 2924/01079* (2013.01)

(58) Field of Classification Search
CPC .......... H01L 2924/01029; H01L 2924/01013; H01L 2924/01079
USPC ........... 257/E23.033, E23.021, E25.029, 680, 257/684, 686, 687, 690, 700, 701, 764, 257/782; 438/125, 614, 669
IPC .......... H01L 2924/1029, 2924/1013, 2924/1079
See application file for complete search history.

(56) References Cited

U.S. PATENT DOCUMENTS

| 6,274,823 | B1 * | 8/2001 | Khandros et al. ............. 174/261 |
| 6,538,210 | B2 * | 3/2003 | Sugaya et al. ................ 174/258 |
| 7,217,994 | B2 * | 5/2007 | Zhu et al. ...................... 257/686 |
| 7,457,129 | B2 * | 11/2008 | Ikezawa et al. ............... 361/735 |
| 7,551,454 | B2 | 6/2009 | Wuchse et al. |
| 8,035,979 | B2 * | 10/2011 | Yoshino et al. ............... 361/761 |
| 8,039,755 | B2 | 10/2011 | Bauer et al. |
| 8,039,939 | B2 * | 10/2011 | Hwang ......................... 257/680 |
| 8,072,768 | B2 * | 12/2011 | Ockenfuss et al. ........... 361/761 |
| 8,130,507 | B2 * | 3/2012 | Origuchi et al. .............. 361/760 |
| 8,159,828 | B2 * | 4/2012 | Sun et al. ...................... 361/761 |
| 8,169,060 | B2 * | 5/2012 | Maurer et al. ................. 257/662 |
| 8,248,561 | B2 * | 8/2012 | Iwamoto ...................... 349/119 |
| 8,735,222 | B2 * | 5/2014 | Goto et al. .................... 438/121 |
| 2010/0208442 | A1 * | 8/2010 | Asano et al. .................. 361/783 |
| 2014/0091442 | A1 * | 4/2014 | Cheah et al. .................. 257/666 |

* cited by examiner

*Primary Examiner* — Eugene Lee
(74) *Attorney, Agent, or Firm* — Blakely, Sokoloff, Taylor & Zafman LLP

(57) ABSTRACT

An apparatus including a printed circuit board including a body of a plurality of alternating layers of conductive material and insulating material; and a package including a die disposed within the body of the printed circuit board. A method including forming a printed circuit board including a core and a build-up section including alternating layers of conductive material and insulating material coupled to the core; and coupling a package including a die to the core of the printed circuit board such that at least a portion of a sidewall of the package is embedded in at least a portion of the build-up section. An apparatus including a printed circuit board including a body; a computing device including a package including a microprocessor disposed within the body of the printed circuit board; and a peripheral device that provides input or output to the computing device.

10 Claims, 4 Drawing Sheets

EMBEDDED PACKAGE IN PCB BUILD UP

FIELD

Printed Circuit Boards.

BACKGROUND

Mobile and handheld products are trending towards thinner form factors. Studies show that consumers are willing to pay for thinner and lighter devices to achieve true mobility. Thus device manufacturers are putting emphasis on engineering resources to satisfy consumers.

DETAILED DESCRIPTION

One component of a computing device that affects an overall thickness of a device, particularly mobile and handheld products, is the motherboard. Currently, a thickness of mobile handheld devices, including mobile personal computers (PCs) and notebooks, is limited by a total of a motherboard stack over the keyboard due to the physical size of the motherboard. Even where the motherboard is installed at a similar level to a battery and other discreet boards, the size of the motherboard impacts these components, such as impacts the battery size which is a key performance specification. One technique to reduce a thickness or Z height and/or a motherboard size is utilizing a high density interconnect (HDI) printed circuit board process. Generally, the HDI process utilizes build up layers on a multilayer core with laser drilled microvias on each buildup to perform signal connections as opposed to a conventional type 3 printed circuit board that uses plated through holes. The use of the laser drilled microvia process in the HDI process enables higher density routing with smaller dimensioned interconnect vias, hence reducing the total board size as well as z-height.

Figure 1:
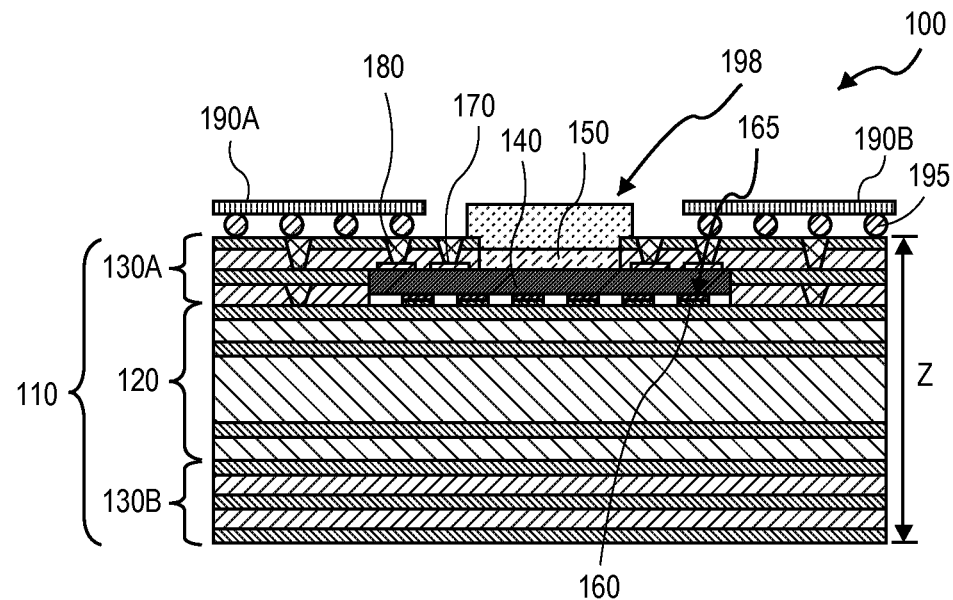
FIG. 1 shows a cross-sectional side view of an embodiment of a portion of a printed circuit including a package embedded therein.

A printed circuit board such as a motherboard is used to mechanically support and electrically connect an electronic component such as a microprocessor or application processor. FIG. 1 shows a cross-sectional side view of a portion of a printed circuit board having an embedded component, in this case a package including a microprocessor (e.g., central processing unit, system on chip), connected to the core of the printed circuit board. Referring to FIG. 1, in this embodiment, printed circuit board 110 includes core 120 of an insulative material such as a prepreg material onto which conductive planes (e.g., ground plane, power plane) or tracks or pathways or signal traces are formed. In this embodiment, a top conductive plane or signal line includes an array of conductive pads 160 that may be connected to the conductive plane of signal line or other planes or signal lines through, for example, conductive microvias. Pads 160 are configured for and are aligned to connect to conductive pads or points of package 140. Package 140 is, for example, a flip-chip package (e.g., ultra thin core flip-chip package) or a Bumpless Build-Up Layer (BBUL) package having, for example, a land grid array defining contact points, lands or pads 165 to connect to conductive pads 160. The connection of contact points 165 to conductive pads may be through solder connections or, in another embodiment through a conductive paste, such as an anisotropic conductive film (ACF) epoxy adhesive. FIG. 1 also shows die 150 that is, for example, a microprocessor, connected to package 140 on a side opposite the side in contact with conductive pads 160.

As noted above, package 140 is connected to a pad array on core 120 of printed circuit board 110. Package 140 including die 150 is embedded in circuit board 110 in the sense that since it is coupled to the core at its base and buildup layers of a printed circuit board surround the opposing sides of the package. FIG. 1 shows buildup layer portion 130A and buildup layer portion 130B connected to core 120. Each of buildup layer portion 130A and buildup layer portion 130B includes alternating layers of conductive material and dielectric material. The conductive material forms, for example, planes, signal traces or pathways while the insulating material insulates one conductive layer from another. In the embodiment shown in FIG. 1, each of buildup layer portion 130A and buildup layer portion 130B includes two build up layers (e.g., two layers of conductive material and insulating material). It is appreciated that in other embodiments, less than or more than two buildup layers may be utilized and the number of layers of conductive material and insulating material need not be the same in each of buildup layer portion 130A and buildup layer portion 130B.

In the embodiment shown in FIG. 1, package 140 includes contact points, lands or pads 165 on a bottom side of the package (as viewed) as well as contact points, lands or pads 170 on a topside (device side). Contact points, lands or pads 165 and contact points, lands or pads 170 may be used to connect to printed circuit board 110. Additionally, contact points, lands or pads 165 and contacts points, lands or pads 170 may be utilized to connect package 140 to a device external to the printed circuit board, such as a memory device (e.g., a dynamic random access memory (DRAM)). FIG. 1 shows conductive microvias 180 formed, for example, by a laser drill process connecting to contact points of external device 190A through a contact material such as a solder ball. Similar microvias may be used to connect one or more contact points of device 190B with package 140.

As noted, in the embodiment shown in FIG. 1, package 140 and die 150 are embedded in printed circuit board 110 in the sense that at least package 140, and opposing sides and a bottom of die 150 are surrounded by a material of buildup layer portion 130A. By embedding package 140 and die 150 in printed circuit board 110, it can be seen that a z-height of the board and package is reduced as the package and die are no longer connected to contact points on a surface (e.g., a superior surface (as viewed)) of printed circuit board 110. The z-height is reduced in the sense that the z-height of printed circuit board 110 and package 140 is the z-height of printed circuit board 110 as package 140 is no longer connected to contact points on a superior surface of printed circuit board 110. Also, in this embodiment, a portion of a topside of die 150 is exposed. In one embodiment, overlying chip 150 on a surface of printed circuit board 110 (top surface as viewed) may be a heat-transfer device 198, such as heat spreader, or other device.

Figure 2:
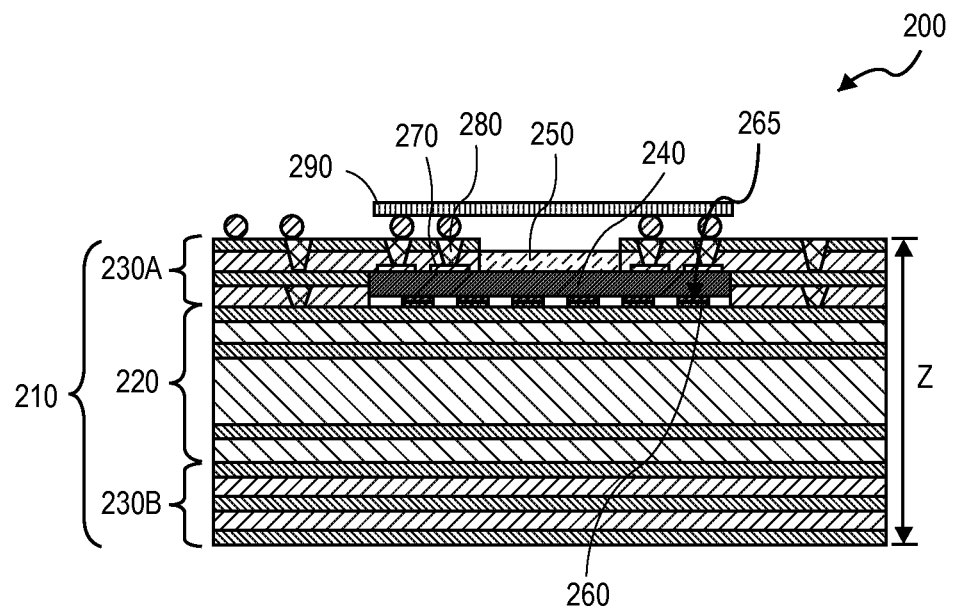
FIG. 2 shows a cross-sectional side view of another embodiment of a portion of a printed circuit board including a package embedded therein.

FIG. 2 shows another embodiment of a printed circuit board including an embedded package. In this embodiment, printed circuit board 210, such as an HDI printed circuit board, includes core 220 of an insulating material having one or more planes and/or pathways or signal traces. Overlying a surface of core 220 is an array of contact points lands or pads 260 positioned to connect and connected to an array of contact points, lands or pads 265 of package 240. Package 240 is, for example, a flip-chip package or a BBUL package having contact points 265 as a land grid array patterned to connect to conductive points 260 through, for example, a solder connection or ACF.

Referring to FIG. 2, package 240 including die 250 is embedded in buildup layers of printed circuit board 210. FIG. 2 shows buildup layer portion 230A and buildup layer portion 230B connected to core 220 with package 240 including die 250 embedded in buildup layer portion 230A. Buildup layer portion 230A and buildup layer portion 230B are each defined by are alternating layers of conductive material and insulating material. In the embodiment shown in FIG. 2, buildup layer portion 230A and buildup layer portion 230B each include two conductive layers and two insulating layers. It is appreciated that in other embodiments, less than or more than two conductive layers may be included and the number of conductive and insulating layers may be different for each of buildup layer portion 230A and buildup layer portion 230B.

In the embodiment shown in FIG. 2, package 240 includes contact points, lands or pads 265 on a bottom surface thereof (as viewed). Package 240 also includes contact points, lands or pads 270 as a land grid array on a superior or device side surface. As noted, contact points or pads 260 are connected to contact points 260 on core 220 that are connected to signal lines or planes (ground planes, power planes). In this embodiment, contact points or pads 270 on a superior surface of package 240 may be connected to signal traces or planes associated with buildup layer portion 230A and/or to an external device. FIG. 2 shows external device 290 that is, for example, a memory device (e.g., a DRAM device) connected to contact points 270 thorough conductive microvias 280 in buildup layer portion 230A.

In the embodiment shown in FIG. 2, package 240 including die 250 is embedded in buildup layer portion 230A. In this embodiment, the buildup layers surround sides and a top or superior surface each of package 240 and die 250 so that the package and die are completely embedded within printed circuit board 210. By completely embedding package 240 and die 250 within the circuit board 210, it can be seen that the z-height of the printed circuit board and package is reduced to that of the z-height of the printed circuit board as the package and die are no longer connected to contact points on a surface of the printed circuit board but the package is embedded in the printed circuit board.

Figure 3:
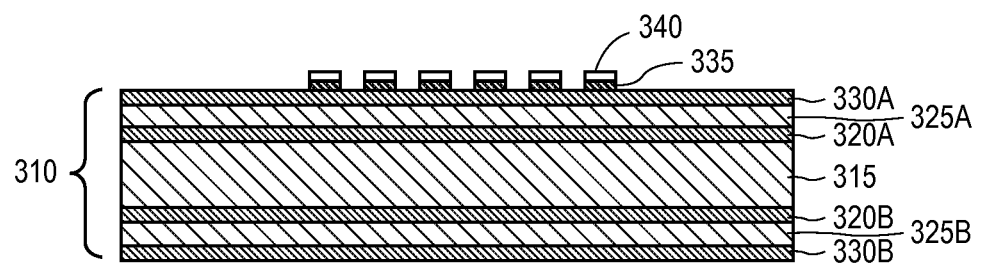
FIG. 3 shows a cross-sectional side of a portion of a core of a printed circuit board.

FIGS. 3-6 describe a process of forming a printed circuit board with an embedded package. In this embodiment, the process relates to forming a printed circuit board/embedded package similar to structure 200 shown in FIG. 2. Referring to FIG. 3, FIG. 3 shows printed circuit board core 310 that is, for example, a core formed according to an printed circuit board process. Core 310 is, for example, a multilayer core including dielectric layer 315 of, for example, a prepreg material onto which conductive and insulative layers are introduced, such as by a film process wherein a film or sheet of insulative material and conductive material are alternately laid on, in this case, opposite sides of core 315. FIG. 3 shows conductive layer 320A and conductive layer 320B of, for example, a copper that is, for example, is a conductive material that serves as, for example, a power or ground plane or pathway or signal trace. A plane, such as a ground plane or power plane may simply be a conductive sheet or may be patterned as desired. Similarly, where conductive layer 320A is a pathway or signal trace, the layer may be patterned. A film or sheet may be patterned using photolithographic and etch techniques.

Overlying respective ones of conductive layer 320A and conductive layer 320B is insulating layer 325A and 325B. Insulating layer 325A and insulating layer 325B may be introduced as a film or sheet of, for example, a prepreg material to a thickness suitable to insulate conductive layer 320A and conductive layer 320B, respectively. Overlying respective lines of insulating layer 325A and insulating layer 325B is conductive layer 330A and 330B similar to conductive layer 320A and 320B, each of conductive layer 330A and conductive layer 330B may be a power or ground plane or pathway or signal trace. Where desired, each conductive layer may be patterned as is appropriate. The total number of conductive layers and insulating layers can be more or less than illustrated.

Overlying conductive layer 330A on a surface of core 310 are an array of contact points, lands or pads 335. Contact points 335 are a conductive pattern resulting from an etching and plating process. Contact points 335 may be arranged in an array to correspond to an array of contact points, lands or pads of a package to be placed on core 310. Overlying contacts points 335, in one embodiment, is bonding material 340. In one embodiment, bonding material 340 is a conductive adhesive such as an epoxy adhesive such as anisotropic film (ACF). In another embodiment, bonding material 340 may be a solder material. An advantage to a conductively adhesive for bonding material 340 is that it will tend to increase the reliability of the circuit board contact point to package contact point connection while providing a relatively minimal z-height contribution.

Figure 4:
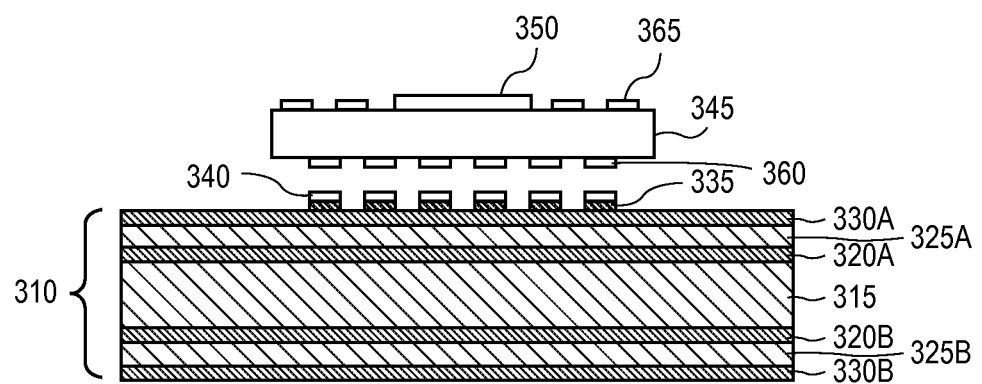
FIG. 4 shows the structure of FIG. 3 following the formation of contact points, lands or pads on a surface of the core of the printed circuit board and the attachment of a package thereto.

FIG. 4 shows the structure of FIG. 3 following the introduction of package 345 onto core 310. In one embodiment, package 345 is a flip-chip package including device 350 such as a die including a microprocessor. In another embodiment, package 345 is a BBUL package. On a bottom side of package 345 (as viewed) the package includes an array of contact points, lands or pads 360 arranged, for example, as a land grid array. The array of contact points 360 may be aligned with one or more of contact points 335 on core 310. In this manner, desired ones of the array of contact points 360 may be connected to contact points 335 using, for example, bonding material 340 (e.g., a conductive epoxy adhesive).

A superior or device side of package 345 in the embodiment shown in FIG. 4, also, includes contact points, lands or pads 365. Contact points 365 may be routed to signal lines or traces or planes associated with core 310 subsequent build up layers and/or a device that could be external to the ultimate printed circuit board that is fabricated.

Figure 5:
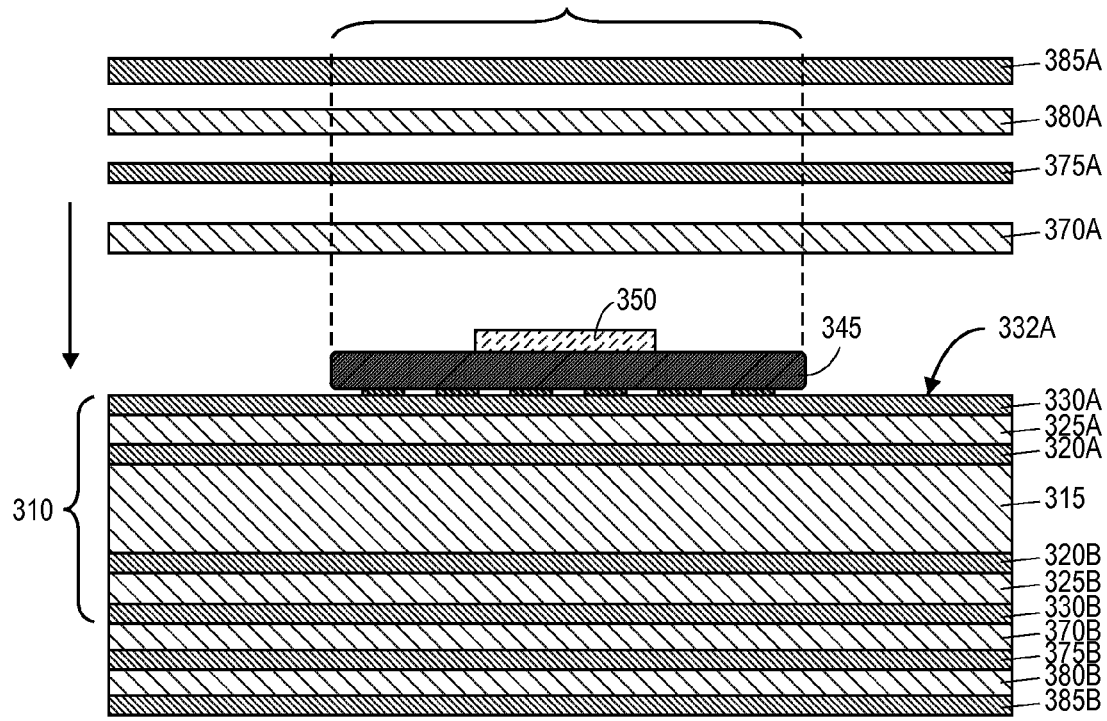
FIG. 5 shows the structure of FIG. 4 following the addition of a buildup layer portion on one side of the core and the introduction of buildup layers to form a buildup layer portion on an opposite side of the core.

FIG. 5 shows the structure of FIG. 4 with package 345 connected to core 310 and shows the addition of buildup layers to the printed circuit board structure. Buildup layers may be introduced using an HDI printed circuit board process wherein a film or sheet of conductive or insulative material is introduced. In the embodiment shown in FIG. 5, package 345 and die 350 extend from a superior surface (surface 332A) of core 310. Accordingly, a film or sheet of insulating or conductive material cannot be directly applied to core 310 as a conventional HDI printed circuit board process without contacting package 345 and/or die 350. Therefore, in one embodiment, prior to applying an insulating or conductive material as a sheet or film, an opening having dimensions equivalent to the dimensions of the wider of package 345 and die 350 is made in the films where necessary to place the film(s) on core 310. One way an opening may be made in a film or a sheet is by a laser cutting process. Once an opening is made, the film(s) may be introduced onto core 310. FIG. 5 shows insulating film 370 being introduced initially on core 310 and on surface 332A of conductive layer 330A. In one embodiment, insulating film 370A is a prepreg material introduced to a desired thickness as an insulator in an HDI printed circuit board process. Overlying insulating layer 370A is conductive film 375A of, for example, a copper material. Conductive layer 375A may be introduced as a sheet and, where necessary, patterned, using, for example, photolithography and etch techniques. The addition of buildup layers to core 310 may continue as desired. FIG. 5 shows additional buildup layers of insulating film 380A and conductive film 385A to define a buildup layer portion on one side of core 310. It is appreciated that where an opening are formed in a film prior to the film being applied to the core, the opening in such film need only be as large of an area as necessary or desired to surround package 345 and/or die 350. Accordingly, an area of an opening of insulating layer 380A and/or conductive film 385A may be less than an area of openings in conductive film 375A and/or insulating film 370A. FIG. 5 finally shows insulating films 370B and 380B and conductive films 375B and 385B defining another buildup layer portion on a second side of core 310.

Figure 6:
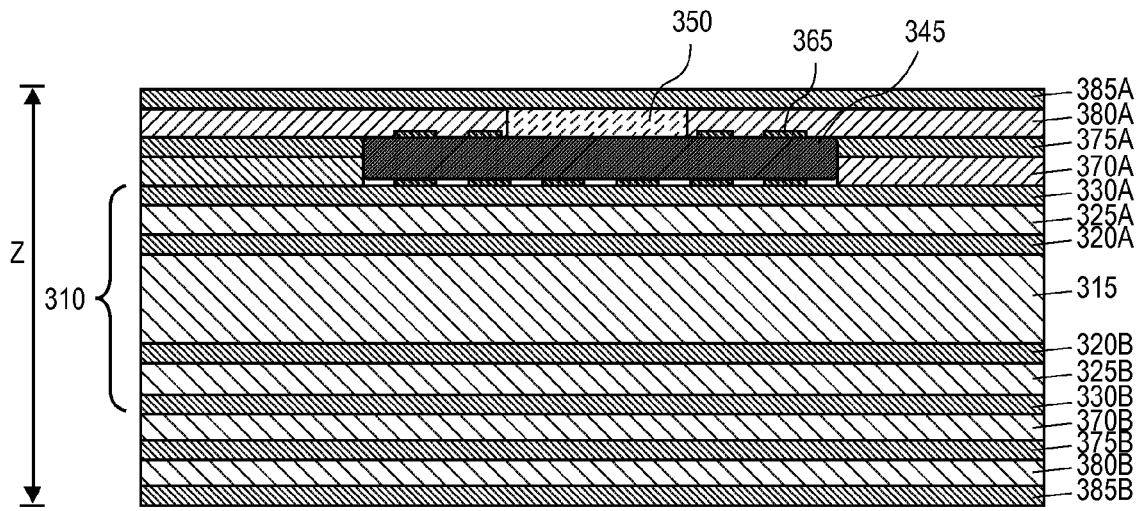
FIG. 6 shows the structure of FIG. 5 following the embedding of the package in the printed circuit board.

FIG. 6 shows the structure of FIG. 5 following the introduction of multiple buildup layers on core 310. In this embodiment, two pairs of conductive and insulative layers constitute the buildup layers. It is appreciated, that the buildup layers may consist of less than or more than two pairs of buildup layers. Referring to FIG. 6, the structure shows insulating layer 370A on a superior surface of core 310 and insulating layer 370B on the bottom surface of core 310. Overlying insulating layer 370A is conductive layer 375A and underlying insulating layer 370B is conductive layer 375B. Overlying conductive layer 375A is insulating layer 380A and underlying conductive layer 375B is insulating layer 380B. Overlying conductive layer 375A is insulating layer 380A followed by conductive layer 385A. Underlying conductive layer 375B is insulating layer 380B followed by conductive layer 385B. It is appreciated that in addition to introducing insulating and conductive layers or core 310, a HDI printed circuit board process may be followed. This includes patterning conductive films as desired (e.g., through photolithography and etch techniques) and locating and forming conductive microvias by way of, for example, laser drilling and filling operation.

FIG. 6 illustrates a printed circuit board including an embedded package therein. The z-height of the printed circuit board and package is equivalent to a z-height of the printed circuit board. In this embodiment, package 345 includes contact points, pads or lands on a superior on top side surface (as viewed) contact points or pads 365 provide an increased density of second level of interconnects that allows for signal breakout on the superior side of the board and improves signal integrity performance with shorter signal paths to component(s) that are placed on a superior side of the die. Embedding package 345 in a printed circuit board also eliminates the need for an interposer that has been used, for example, in package on package configurations, since the build-up layer portion around package 345 can function as an interposer.

Further, power delivery is improved since decoupling capacitors can be mounted directly on top of die 350 as viewed (e.g., directly on top of a central processing unit or system on a chip). In another embodiment, one or more decoupling capacitors may be embedded.

To form the structure of FIG. 1, the insulating and/or conductive build-up films of the printed circuit board may be applied with an opening to expose a surface of die 350 or the opening(s) may be cut in the film(s) after their introduction. Representatively, a die 350 can be a device operating at higher power where it may be desirable to include thermal dissipation. In such an embodiment, a heat spreader or other thermal solution may be introduced on an exposed surface of the die (see FIG. 1). Additional devices (e.g., a DRAM device) can then be mounted beside the heat spreader using, for example, an embedded conducting film (e.g., a microstrip) to perform the input/output connection through microvias.

In each of the embodiments described with reference to FIG. 1 and FIG. 2 and the process of FIGS. 3-6, a single component, a die, is embedded in a printed circuit board. In another embodiment, additional components may be embedded using the same techniques.

Figure 7:
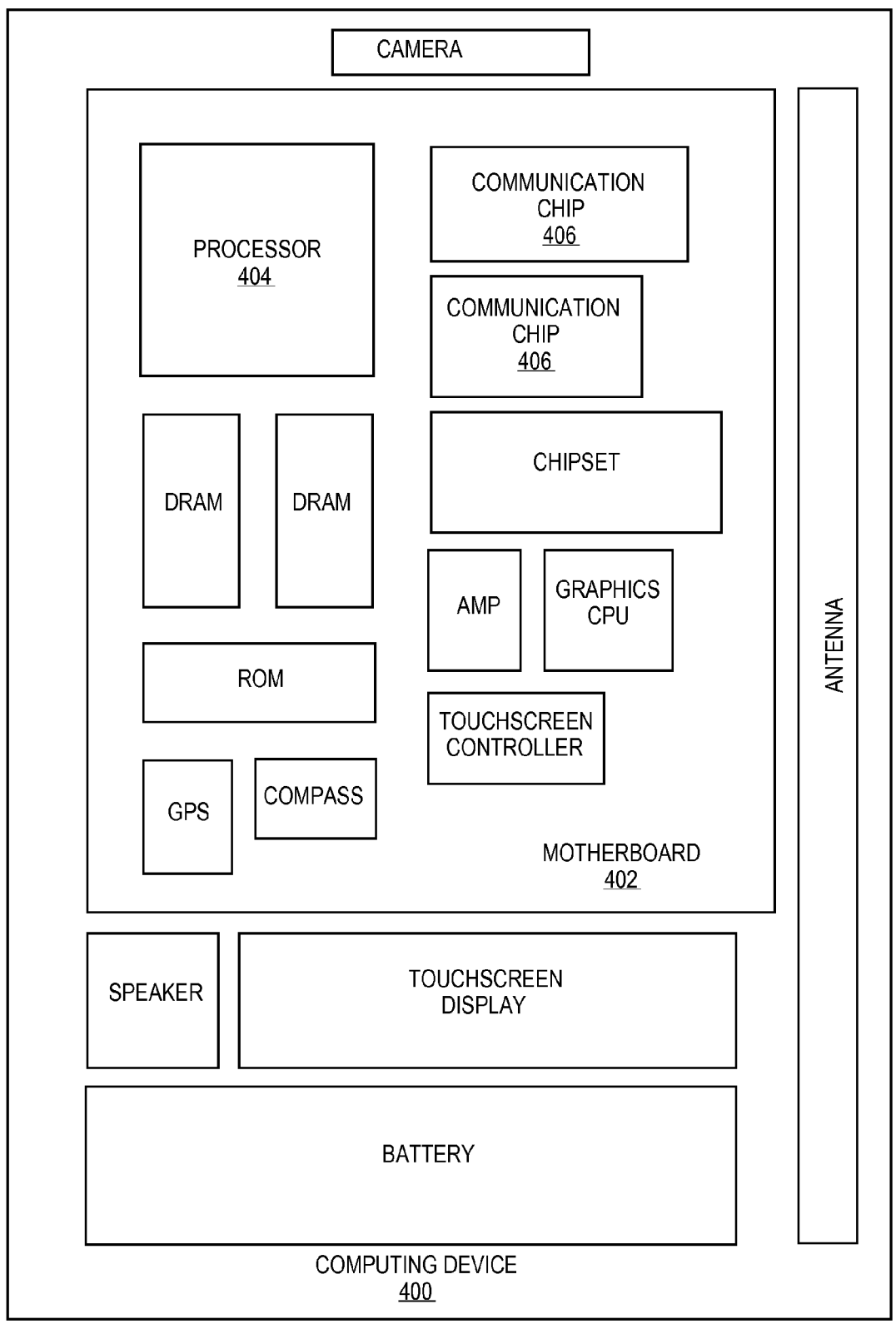
FIG. 7 illustrates a schematic illustration of a computing device.

FIG. 7 illustrates a computing device 400 in accordance with one implementation of the invention. Computing device 400 houses board 402. Board 402 may include a number of components, including but not limited to processor 404 and at least one communication chip 406. Processor 404 is physically and electrically coupled to board 402. In some implementations the at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, first communication chip 406 may be dedicated to shorter range wireless communications such as Wi-Fi and Bluetooth and second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations of the invention, the integrated circuit die of the processor includes one or more devices, such as transistors and CMOS implementations, that are formed in accordance with embodiments herein. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, the integrated circuit die of the communication chip includes one or more devices, such as transistors and CMOS implementations, that are formed in accordance with implementations described above.

In further implementations, another component housed within computing device 400 may contain an integrated circuit die that includes one or more devices, such as transistors and CMOS implementations, that are formed in accordance with implementations described above In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
a printed circuit board comprising a body of a plurality of alternating layers of conductive material and insulating material; and
a package comprising a die disposed within the body of the printed circuit board, wherein the package comprises a plurality of package contact points coupled to contact points of the die and at least one of the package contact points is coupled to the one of the plurality of conductive material of the printed circuit board,
wherein the package comprises a first side comprising the plurality of external package contact points and a second side opposite the first side, wherein a portion of the second side is exposed in a surface of the printed circuit board.

2. The apparatus of claim 1, wherein the plurality of alternating layers of conductive material of the printed circuit board comprise at least one patterned signal layer and at least one of the package contact points is coupled to the at least one patterned signal layer.

3. The apparatus of claim 1, wherein the plurality of alternating layers of conductive material of the printed circuit board comprise at least one patterned signal layer and at least one reference layer, wherein the plurality of package contact points is coupled to the at least one patterned signal layer and the at least one reference layer.

4. The apparatus of claim 1, wherein the package comprises a first side comprising the plurality of external package contact points and a second side opposite the first side, wherein each of the first side and the second side are embedded in the printed circuit board.

5. The apparatus of claim 1, wherein the package comprises a first side and a second side opposite the first side, wherein a first portion of the plurality of package contact points are disposed on the first side of the package and a second portion of the plurality of package contact points are disposed on the second side of the package.

6. The apparatus of claim 5, wherein the die is disposed in the package with a device side oriented toward the first side of the package.

7. The apparatus of claim 1, wherein the body of the printed circuit board comprises a core and the package and the plurality of alternating layers of conductive material and insulating material are disposed on the core.

8. An apparatus comprising:
a printed circuit board comprising a body of a plurality of alternating layers of conductive material and insulating material;
a computing device comprising a package comprising a microprocessor disposed within the body of the printed circuit board, wherein the package comprises a plurality of package contact points coupled to contact points of the die and at least one of the package contact points is coupled to the one of the plurality of conductive material of the printed circuit board; and
a peripheral device that provides input or output to the computing device.

9. The apparatus of claim 8, wherein the printed circuit board and peripheral device are embodied in a hand-held product.

10. The apparatus of claim 8, wherein the package comprises a first side and a second side opposite the first side, wherein a first portion of the plurality of package contact points are disposed on the first side of the package and a second portion of the plurality of package contact points are disposed on the second side of the package, the apparatus further comprising a memory device coupled to the second portion of the plurality of package contact points.

* * * * *